United States Patent [19]
Daley et al.

[11] Patent Number: 5,417,799
[45] Date of Patent: May 23, 1995

[54] REACTIVE ION ETCHING OF GRATINGS AND CROSS GRATINGS STRUCTURES

[75] Inventors: Thomas W. Daley, Inglewood, Calif.; Charles L. Schaub, Pleasantville, N.Y.; Hugh L. Garvin, Malibu; Klaus Robinson, Woodland Hills, both of Calif.

[73] Assignee: Hughes Aircraft Company, Los Angeles, Calif.

[21] Appl. No.: 124,057

[22] Filed: Sep. 20, 1993

[51] Int. Cl.$^6$ ................................................ B44C 1/00
[52] U.S. Cl. ................................... 216/24; 216/57; 216/66; 216/47; 216/79; 216/77
[58] Field of Search ............... 156/643, 652, 653, 655, 156/656, 657, 661.1; 204/192.34

[56] References Cited

U.S. PATENT DOCUMENTS

| | | | |
|---|---|---|---|
| 4,131,506 | 12/1978 | Namba et al. | 204/192.34 X |
| 4,275,286 | 6/1981 | Hackett, Jr. | 219/121 |
| 4,474,642 | 10/1984 | Nakane et al. | 156/661.1 X |
| 4,505,782 | 3/1985 | Jacob et al. | 156/643 |
| 4,797,316 | 1/1989 | Hecq et al. | 156/663 X |
| 4,968,382 | 11/1990 | Jacobson et al. | 156/661.1 X |
| 5,148,302 | 9/1992 | Nagano et al. | 359/95 |
| 5,221,429 | 6/1993 | Makuta | 156/662 X |
| 5,225,039 | 7/1993 | Ohguri | 156/662 X |
| 5,316,640 | 5/1994 | Wakabayashi et al. | 156/643 X |

FOREIGN PATENT DOCUMENTS

A0176684  4/1986  European Pat. Off. .
298041  10/1992  Japan ........................... 204/192.34

OTHER PUBLICATIONS

Matsui et al., "Microfabrication of LiNbO$_3$ by Reactive Ion-Beam Etching", Japanese Journal of Applied Physics, vol. 19, No. 8, Aug. 1980, pp. L463–L465.

Revell et al., "Reactive Ion Beam Etching of Silicon Compounds with a Saddle-field Ion Source", J. Vac. Sci. Technol. 19(4), Nov./Dec. 1981, pp. 1398–1402.

Cantagrei, "Comparison of the Properties of Different Materials Used as Masks for Ion-beam Etching", J. Vac. Sci. Technol., vol. 12, No. 6, Nov./Dec. 1975, pp. 1340–1343.

*Primary Examiner*—Thi Dang
*Attorney, Agent, or Firm*—M. E. Lachman; M. W. Sales; W. K. Denson-Low

[57] ABSTRACT

A process is provided for modifying a surface of a large area, non-planar substrate to form micro structures therein that alter its optical properties. The process includes forming the micro structures by reactive ion beam etching through a chosen pattern that has been prepared on the surface.

9 Claims, 2 Drawing Sheets

REACTIVE ION ETCHING OF GRATINGS AND CROSS GRATINGS STRUCTURES

BACKGROUND OF THE INVENTION

1. Field of the Invention

The present invention relates to the modification of optical properties of a surface, and, more particularly, to ion etching of the surface with chemically active ions.

2. Description of Related Art

The optical properties of a surface can be modified by fabricating micro structures into the surface. These structures are useful in the fields of optical gratings, crossed grating structures, and binary optics.

Current etching technology for optical surfaces depends upon the removal of material from the substrate by kinetic bombardment. The kinetic energy of the incoming ion, typically a noble gas such as argon, is transferred to the substrate at the point of impact, causing substrate molecules to break off.

However, the prior art approach suffers from two disadvantages. The first relates to the presence of accumulated debris in the etched areas, and the second relates to control of depth and shape of the etched areas.

With regard to accumulated debris, the removed material can fall back into the etched structures, like debris falling into a meteor crater, or it can deposit onto the sidewalls of etched grooves. This debris prevents the etching of highly defined or deep structures that are vital to tailoring the properties of an optical surfaces.

With regard to control of depth and shape of the etched areas, the kinetic energy of the ions by the prior art process is varied by adjusting the anode voltage. However, this method of control does not have sufficient precision.

Thus, there remains a need for an etching process to modify the surface for the formation of precision optical gratings, crossed grating structures, and binary optics.

SUMMARY OF THE INVENTION

In accordance with the invention, a process is provided for modifying a surface substrate to form micro structures therein that alter its optical properties. The process comprises forming the micro structures by reactive ion beam etching through a chosen pattern that has been prepared on the surface.

Reactive ion beam etching (RIBE) of optical surfaces has two distinct advantages to the prior art methods. First, RIBE enhances removal of debris. Because the reactive ion undergoes a chemical reaction with the substrate, the removed material can be in the form of a volatile gas that is easily pumped away. Second, RIBE permits precision control of depth and shape of the etched areas, especially when surfaces are large or uneven and cannot be uniformly etched by conventional (plasma generated) reactive ion etching (RIE). Because the material removal method is due to a chemical reaction, controlling the percentage of the reactive ions in the gas mixture in relation to inert ions gives unprecedented control of the etch rate and thereby the microstructure depth and shape.

DESCRIPTION OF THE PREFERRED EMBODIMENTS

Precision diffraction gratings have been fabricated for over 20 years. A diffraction grating is a periodic structure which is etched into the mirror substrate or coating material. Because of the long history in the fabrication of gratings, facilities for designing, fabricating, and testing these periodic structures have been developed. The same fabrication approach and proven facilities used for grating manufacturing can be used to fabricate crossed grating structures and binary optical materials.

Crossed gratings comprise a grid of grooves of a depth and periodicity to trap light. Such structures are used to reduce the effects of stray light in optical paths.

Binary optics is a digital approach to an analog situation. In this instance, a series of discrete etched steps is formed in a surface to approximate a surface having a smoothly varying topography.

In accordance with the invention, a new way of ion etching that facilitates the production of these optical surfaces, called Reactive Ion Beam Etching (RIBE), is employed. While RIBE is a known process per se, its use in fabricating precision optical structures on surfaces is considered novel.

The basic idea is to etch the ion-masked areas of the optical surfaces with ions that chemically react with the substrate, thereby producing a faster, deeper and more controlled etch than existing techniques. These techniques constitute a new and unique method of creating optical surfaces, particularly in the production of cross grating structures that simulate anti-reflection layers.

Reactive ion beam etching produces superior microstructure surfaces for optical gratings, crossed grating structures and binary optics. Specific advantages include greater attainable depth and precision control of the etched shape. These advantages are unobtainable using common reactive ion etching techniques used in the manufacture of integrated circuits. The use of reactive ion beam etching in accordance with the invention is of fundamental importance in producing superior optical surfaces based on micro structures.

Figure 1A:
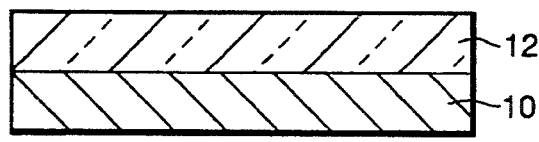
FIGS. 1a–f depict, in cross-section, the process of the invention.
Figure 1B:
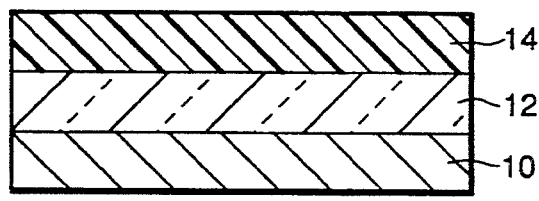
Figure 1C:
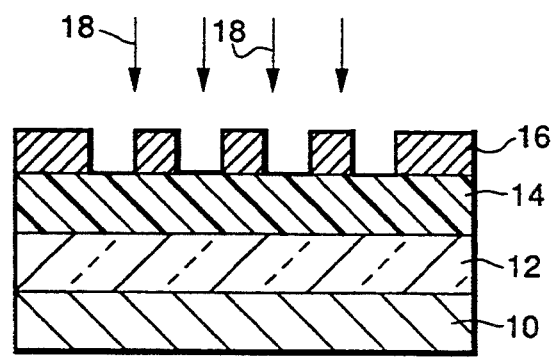
Figure 1D:
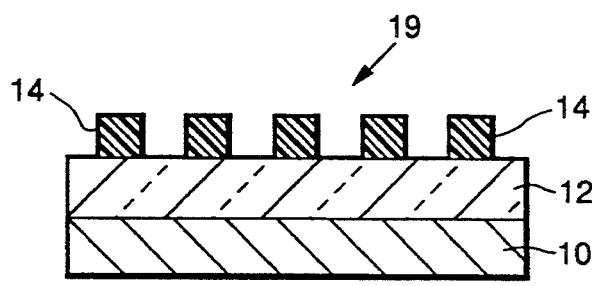
Figure 1E:
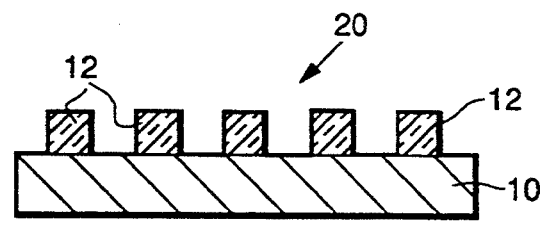
Figure 1F:
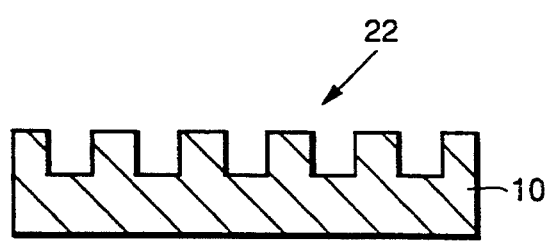
Figure 2:
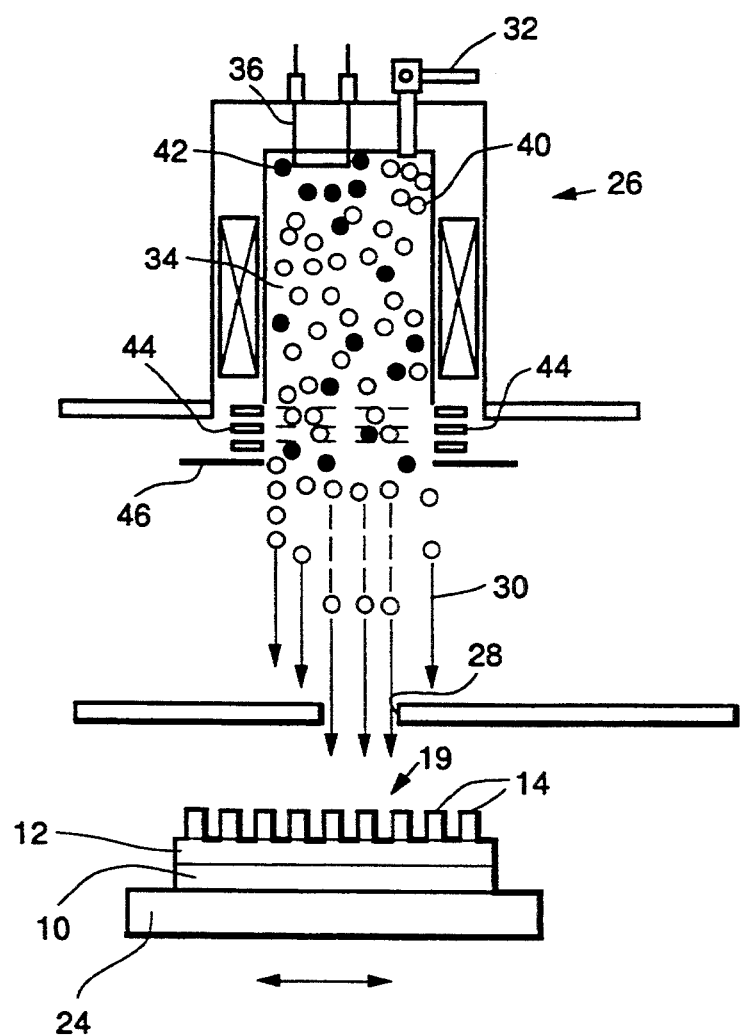
FIG. 2 is a schematic diagram of apparatus used in the practice of the invention.

The process of the present invention is depicted in FIGS. 1 and 2. In the first step of the process, shown in FIG. 1a, a substrate material, or baffle material, 10 is cleaned by conventional methods to prepare it for optical coating. For diffraction gratings, examples of baffles include any of the common materials used to fabricate such diffraction gratings, such as glass, quartz, CdSe, or ZnSe, to name a few. For crossed gratings, light weight metals, such as beryllium or aluminum, are usually employed. Alternative materials include ceramics, such as carbides, borides, and nitrides.

A thin layer 12 of an appropriate coating material that reacts with the reacting gas is deposited on the surface of the selected baffle material 10. An example of such a material is silica, $SiO_2$. Other oxides may also be employed in the practice of the present invention.

The coating material 12 must be thick enough so as to be free of pinholes, but not so thick as to require an undue amount of time for etching through, employing RIBE. Generally, the coating material 12 ranges in thickness from about 0.05 to 0.5 $\mu$m. As an example, for $SiO_2$, a thickness of about 0.2 $\mu$m is considered sufficient.

As shown in FIG. 1b, the coating layer 12 is then covered with a photoresist layer 14, which is used to optically record the desired periodic structure to form the grating or other optical structure. The composition of the photoresist layer 14 and its processing are conventional. The photoresist layer 14 is deposited to a thickness sufficient to permit transfer of the pattern to the underlying coating layer 12.

To place the pattern into the photoresist layer 14, a mask 16 is placed onto the surface of the photoresist and illuminated with ultraviolet (UV) radiation 18 from an ultraviolet light source (not shown) for a period of time, typically 10 to 20 seconds. A mercury source is conveniently employed. This portion of the process is depicted in FIG. 1c. The short wavelength radiation 18 passing through transparent portions (not shown) of the mask 16 causes chemical changes in the exposed areas of the photoresist 14.

In an alternative embodiment, involving producing a holographic image, two beams of coherent light are interfered at the substrate surface, forming a fringe pattern (not shown) which is recorded into the photoresist layer 14. An advantage of this approach over the use of UV radiation is that large areas, on the order of 1 meter dimension, may be processed. Lasers operating in the blue portion of the visible spectrum are employed, for example, having a wavelength of about 4131 Å.

The contact print mask 16 comprises a metal or plastic substrate with opened and shadowed areas. By placing the mask 16 onto the photoresist layer 14 and illuminating with light 18, open areas of the mask allow light to expose the photoresist while the shadowed areas remain dark and unexposed.

Using a developer, the exposed areas of the photoresist 14 washes away, leaving the desired periodic structure 19 in the photoresist, as shown in FIG. 1d. The pattern is then inspected with a microscope to determine that the features are well-delineated and that the streets of the photoresist pattern are open.

Next, using reactive ion beam etching with a fluorine-containing gaseous etchant, such as $CF_4$ or $CHF_3$, the pattern 19 is transferred into the $SiO_2$ layer 12, to form a replicated pattern 20, as shown in FIG. 1e. During the reactive ion beam etching, the pressure may range from about $10^{-5}$ to $10^{-3}$ Torr.

The areas of the $SiO_2$ layer 12 which are masked by the photoresist 14 are covered and do not react with the fluorine ions and thus do not etch. The remaining portions of the photoresist layer 14 are then removed, employing conventional solvents.

A second ion etch using a different reactive chemical species replicates the pattern 20 into the substrate 10, forming grooves 22, as shown in FIG. 1f. For example, for beryllium and aluminum, the reactive ion etchant may be derived from chlorine, possibly on an inert gas carrier, such as argon or helium. An example of such a chlorine-containing etchant is $CCl_4$. Again, the pressure may range from about $10^{-5}$ to $10^{-3}$ Torr.

The $SiO_2$ material 1 is much more durable than photoresist and does not deteriorate during the etching of the grooves 22 into the substrate 10. As a final step, the $SiO_2$ layer 12 is chemically removed from the substrate 1, leaving the periodic features 22 undisturbed.

The process of the invention permits the fabrication of grooves about 1 $\mu$m across and about 0.5 to 1.5 $\mu$m deep, with a periodicity of 2 to 3 $\mu$m for infrared applications. For visible applications, the grooves are 0.5 to 1.5 $\mu$m across and about 0.7 $\mu$m deep, with a periodicity of about 0.5 $\mu$m. The foregoing exemplary dimensions and wavelengths are for crossed grating applications.

For diffraction gratings, the same periodicity is employed, but the depth may range from less than about 0.1 $\mu$m up to about 0.25 $\mu$m, depending on the wavelength to be diffracted.

Advantageously, the process of the invention permits fabrication of sub-micrometer-sized features, such as grooves, having an aspect ratio of greater than one, on large area (to meter-sized dimensions), non-planar surfaces, where the aspect ratio as used herein is defined as the ratio of depth to width. Such capabilities are not available with conventional plasma RIE or by ion beam milling (sputtering).

In preparing binary optical surfaces, mask patterns are applied to a portion of the surface and the remaining (open) area is removed by the etching process. The desired final optical surface shape is formed by repetition of the masking and etching steps, with the mask periodicity and etch depths set to produce the desired shape.

Reactive ion beam etching is an extremely accurate and controllable process. As shown in FIG. 2, the substrate 10 is translated by a water-cooled translation stage 24 in front of an ion source 26 to achieve etching uniformity in the horizontal plane. A shaped aperture 28 is placed in front of the ion beam 30, generated in the ion source 26, to provide uniformity in the vertical direction.

The ion source 26 comprises a reactive gas input line 32, which introduces a reactive gas or reactive gas mixture into an ion discharge chamber 34. The reactive gas may comprise any of the reactive gases employed in reactive ion etching, such as $CF_4$, $CHF_3$, $SF_6$, $Cl_2$, $CCl_4$, and the like. The reactive gas mixture may comprise a mixture of one or more reactive gases or a mixture of one or more reactive gases with one or more inert gases. Examples of inert gases include He, Ar, Xe, and the like.

A cathode 36, energized by means not shown, forms ions 40 and electrons 42 from the gas mixture. Magnetic pole pieces 44 are optionally employed to improve the plasma efficiency. Such pole pieces are typically incorporated in commercially available RIBE apparatus. A neutralizer 46 provides an excess number of electrons that are trapped in the ion beam and prevent surface charges from accumulating on insulating surfaces that would repel or distort the impinging beam of ions and reactive species.

The process conditions for operating the RIBE apparatus in the practice of the present invention are conventional. Typically, the pressure is about $10^{-4}$ Torr, the beam current density is up to about 1 milliampere per square centimeter (mA/cm$^2$), and the beam energy is about 500 electron volts (eV). The flow rate of the gas is about 8 standard cubic centimeters per minute (sccm), although this value may vary for specific applications.

Using the foregoing process, the ability to place grooves in a wide variety of materials to within $\pm 20$ Å of the design depth has been demonstrated. The uniformity of the etch depth across a substrate is a consistent $\pm 20$ Å.

The reactive ion beam etching process of the present invention produces extremely accurate features in the surface of an optical material. These features are devoid of small filaments and nodules which are susceptible to damage during illumination within an intense laser beam.

An etching process which could be considered but is not as desirable is a conventional argon sputter etching of the surface of the substrate 10 to replicate the pattern 20 therein. This argon ion machining process has several disadvantages when compared to reactive ion beam etching. The first is the inability to produce high quality features of the required depth. With the argon sputtering process, as the groove get deeper, say on the order of 2,000 Å, material cannot make it to the top of the grooves during removal and the material redeposits on the sidewalls and in the bottom of the grooves. This redeposit of material results in the tops and sides of the grooves having a rough, textured finish which is composed of thousands of small nodules of material. These nodules are not firmly attached to the walls and sides and in the event of shock, such as thermal shock from a laser or mechanical shock, these nodules will loosen and cause failure of the optical device.

Thus, there has been disclosed a reactive ion beam etching process for fabricating optical structures in substrates. It will be readily apparent to those skilled in this art that various changes and modifications of an obvious nature may be made without departing from the spirit of the invention, and all such changes and modifications are considered to fall within the scope of the invention, as defined by the appended claims.

What is claimed is:

1. A process for modifying a surface of a substrate to form micro structures therein that alter the optical properties thereof, comprising the steps of:
   (a) forming a coating layer comprising an oxide material on said substrate;
   (b) forming a mask layer on said coating layer;
   (c) forming a pattern in said mask layer;
   (d) reactive ion beam etching said pattern in said coating layer by contact with a first reactive ion beam comprising a fluorine-containing gas to expose portions of said coating layer and leave said mask layer unetched;
   (e) removing said mask layer by application of a solvent;
   (f) reactive ion beam etching through said pattern in said coating layer by contact with a second reactive ion beam which is different from said first reactive ion beam to transfer said pattern into said surface of said substrate and leave said coating layer unetched; and
   (g) removing said coating layer by chemical treatment, wherein said micro structures have a width of about 0.5 to 1.5 micrometers, a depth of about 0.1 to 1.5 micrometers and a ratio of depth to width of greater than one.

2. The process of claim 1 wherein said substrate comprises a metal or ceramic.

3. The process of claim 2 wherein said metal comprises beryllium or aluminum.

4. The process of claim 1 wherein said coating layer comprises silica.

5. The process of claim 1 wherein said mask layer comprises photoresist.

6. The process of claim 5 wherein said pattern is formed in said photoresist layer by applying a contact mask in which is formed said pattern and exposing said photoresist to ultraviolet radiation through said contact mask.

7. The process of claim 6 wherein said pattern is formed in said photoresist layer by forming a holographic image therein from interference of two beams of coherent light.

8. The process of claim 1 wherein said surface is non-planar.

9. The process of claim 1 wherein said surface has an area ranging to meter-size dimensions.

* * * * *